（12） United States Patent
Ma et al.

(10) Patent No.: US 12,507,467 B2
(45) Date of Patent: Dec. 23, 2025

(54) METHOD FOR MANUFACTURING HIGH DIELECTRIC CONSTANT METAL GATE FOR NMOS AND PMOS

(71) Applicant: Shanghai Huali Integrated Circuit Corporation, Shanghai (CN)

(72) Inventors: Weiwei Ma, Shanghai (CN); Ran Huang, Shanghai (CN); Wei Zhou, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 508 days.

(21) Appl. No.: 18/162,638

(22) Filed: Jan. 31, 2023

(65) Prior Publication Data

US 2023/0420304 A1 Dec. 28, 2023

(30) Foreign Application Priority Data

Jun. 28, 2022 (CN) .......................... 202210745997.8

(51) Int. Cl.
*H01L 21/02* (2006.01)
*H10B 10/00* (2023.01)
(Continued)

(52) U.S. Cl.
CPC ........... *H10D 84/038* (2025.01); *H10B 10/12* (2023.02); *H10B 69/00* (2023.02); *H10D 84/0179* (2025.01)

(58) Field of Classification Search
CPC ........ H01L 21/02329; H01L 21/02332; H10D 64/68; H10D 84/0144; H10D 84/0181; H10D 84/8314
See application file for complete search history.

(56) References Cited

U.S. PATENT DOCUMENTS

| 2005/0124109 A1* | 6/2005 | Quevedo-Lopez ..... C23C 16/56 |
| | | 438/785 |
| 2014/0246758 A1* | 9/2014 | Tu ....................... H01L 21/0228 |
| | | 257/632 |

(Continued)

FOREIGN PATENT DOCUMENTS

| CN | 110491775 A * 11/2019 ....... H01L 21/02255 |
| WO | WO-2005004224 A1 * 1/2005 ........... H10D 62/405 |

OTHER PUBLICATIONS

Machine translation of WO 2005/004224 A1 (Year: 2005).*

(Continued)

*Primary Examiner* — Bryan R Junge
(74) *Attorney, Agent, or Firm* — Banner & Witcoff, Ltd.

(57) ABSTRACT

A method is disclosed for manufacturing a high dielectric constant metal gate of NMOS and PMOS, comprising: step 1, forming an interface layer; step 2, forming a high dielectric constant layer; step 3, performing decoupled plasma nitridation; step 4, performing plasma nitridation annealing with a temperature set below a preset first temperature to reduce the number of oxygen vacancies in the high dielectric constant layer; step 5, forming a P-type work function metal layer; step 6, removing the P-type work function metal layer from the region of the gate structure of the NMOS; step 7, forming an N-type work function metal layer, wherein metal atoms of the N-type work function metal layer of a first NMOS diffuses laterally from an interface to the P-type work function metal layer of adjacent first PMOS and are fixed at the oxygen vacancies by forming a dipole; and step 8, forming the metal gate.

14 Claims, 7 Drawing Sheets

(51) Int. Cl.
*H10B 69/00* (2023.01)
*H10D 84/01* (2025.01)
*H10D 84/03* (2025.01)

(56) References Cited

U.S. PATENT DOCUMENTS

| | | | |
|---|---|---|---|
| 2015/0035084 A1* | 2/2015 | Li | H10D 64/017 |
| | | | 438/4 |
| 2018/0151376 A1* | 5/2018 | Choi | H01L 21/28185 |
| 2020/0058558 A1* | 2/2020 | Chu | H10D 84/853 |
| 2021/0193468 A1* | 6/2021 | Hung | H01L 21/02255 |

OTHER PUBLICATIONS

Machine translation of CN 110491775 A (Year: 2019).*
Bienacel et al. 'Effect of post nitridation anneal on physical properties of plasma nitrided oxides,' 2005, Electrochemical Society Proceedings vol. 2005-01, pp. 223-231 (Year: 2005).*
Horii et al. 'Impact of In situ postnitridation annealing for successful fabrication of HfSiON thin film,' 2007, Jpn. J. Appl. Phys. Vol. 46, p. 3229 (Year: 2007).*

* cited by examiner

METHOD FOR MANUFACTURING HIGH DIELECTRIC CONSTANT METAL GATE FOR NMOS AND PMOS

CROSS-REFERENCES TO RELATED APPLICATIONS

This application claims the priority to Chinese patent application No. CN 202210745997.8, filed on Jun. 28, 2022, and entitled "METHOD FOR MANUFACTURING HIGH DIELECTRIC CONSTANT METAL GATE FOR NMOS AND PMOS", the disclosure of which is incorporated herein by reference in its entirety.

TECHNICAL FIELD

The present application relates to a semiconductor integrated circuit, in particular, to a method for manufacturing a high dielectric constant metal gate (HKMG) for an NMOS and a PMOS.

BACKGROUND

The HKMG has a gate dielectric layer with a high dielectric constant (HK) and a metal gate (MG), and thus is usually referred to as HKMG in short in the art. FIG. 1 is a layout of a half-bit cell structure of a static random access memory (SRAM) with an existing HKMG. FIG. 2 is a cross sectional view of a structure of the adjacent first PMOS 302 and first NMOS 301 as cut along line AA in FIG. 1. The cell structure of the SRAM with an existing HKMG includes the adjacent first PMOS 302 and the first NMOS 301 that share a metal gate 109. The HKMG of the first PMOS 302 includes a gate dielectric layer and the metal gate 109. A P-type work function (WF) metal layer 106 and an N-type work function metal layer 107 are provided between the gate dielectric layer and the metal gate 109. The P-type work function metal layer 106 is a work function layer of the first PMOS 302, and the N-type work function metal layer 107 is a work function layer of the first NMOS 301.

The gate dielectric layer and the metal gate 109 both extend into a region for forming the first NMOS 301 and are shared between the first PMOS 302 and the first NMOS 301.

The P-type work function metal layer 106 is located only in the region for forming the first PMOS 302.

The N-type work function metal layer 107 is stacked on the surface of the P-type work function metal layer 106 and extends laterally into the region for forming the first NMOS 301.

Generally, the material of the P-type work function metal layer 106 is TiN, the material of the N-type work function metal layer 107 is TiAl, and the material of the metal gate 109 is Al.

An active region isolated by a shallow trench field oxide 102 is formed on a semiconductor substrate 101. A first active region 101a for the first PMOS 302 is adjacent to a second active region 101b for the first NMOS 301.

A first channel region is formed in a region under the HKMG in the first active region 101a, and the surface of the first channel region is used to form a channel of the first PMOS 302.

A second channel region is formed in a region under the HKMG in the second active region 101b, and the surface of the second channel region is prepared to form a channel of the first NMOS 301.

The gate dielectric layer includes a high dielectric constant layer 104. Generally, the material of the high dielectric constant layer 104 can be one of silicon dioxide, silicon nitride, aluminum oxide, tantalum pentoxide, yttrium oxide, hafnium silicate oxide, hafnium dioxide, lanthanum oxide, zirconium dioxide, strontium titanate, and zirconium silicate oxide.

The gate dielectric layer also can include an interface layer, and the interface layer is located between the high dielectric constant layer 104 and the semiconductor substrate (not shown in FIG. 2). Generally, the material of the interface layer includes silicon oxide.

The gate dielectric layer also includes a bottom barrier metal (BBM) 105, and the bottom barrier metal 105 is located between the high dielectric constant layer 104 and the P-type work function metal layer 106 in the PMOS region 302 and the N-type work function metal layer 107 in the NMOS region 301. The material of the bottom barrier metal 105 includes metal nitride. Generally, the bottom barrier metal 105 is formed by stacking a TiN layer and a TaN layer.

A top barrier metal (TBM) 108 is provided between the N-type work function metal layer 107 and the metal gate 109. In general, the top barrier metal 108 includes a TiN layer or a stack layer having a TiN layer and a Ti layer.

Referring to FIG. 2, a stack structure of a gate structure 201 with a HKMG of the first PMOS 302 includes: the high dielectric constant layer 104, the bottom barrier metal 105, the P-type work function metal layer 106, the N-type work function metal layer 107, the top barrier metal 108, and the metal gate 109.

A stack structure of a gate structure 202 with a HKMG of the first NMOS 301 includes: the high dielectric constant layer 104, the bottom barrier metal 105, the N-type work function metal layer 107, the top barrier metal 108, and the metal gate 109.

The layout in FIG. 1 shows a half circuit diagram of a bit cell structure of the SRAM, which is referred to as the layout of a half-bit cell structure in short. A third NMOS 303 is also shown in FIG. 1. The cell structure of the SRAM includes a pair of CMOS inverters with inputs and outputs in crossing connection. The first PMOS 302 and the first NMOS 301 form one of the CMOS inverters, wherein the first PMOS 302 acts as a P-type pull-up transistor (PPU), and the first NMOS 301 acts as an N-type pull-down transistor (NPD). The third NMOS 303 acts as a selection transistor. Two symmetrical such half-bit cell structures shown in FIG. 1 form a full-bit cell structure.

Currently, HKMG process in the 28 nm node mainly uses the HK first plus MG last manufacturing process, wherein HK first refers to HK formation performed before the formation of a polysilicon dummy gate, and MG last refers to MG formation performed after the formation of the polysilicon dummy gate. In the HK first plus MG last manufacturing process. Both the material and manufacturing process of HKMG may change the work function metal layer of a component, thereby affecting the characteristics of the component. In the industry, HKMG materials for an N-type transistor component, i.e., NPD. A P-type transistor component, i.e., PPU, mainly include HfO2, TiN, TaN, TiAl, Al, etc. In the entire HKMG manufacturing process, materials such as the Al material may have its thermal effect problem directly change or affect the characteristics of the component. Particularly, at the process node below 28 nm, an SRAM region has a high component density, a space between adjacent NPD and PPU is extremely small, with the metal gates shared, the SRAM component is made more vulnerable.

The current HKMG process related to work function metal layers has two modes:

In the first mode, work function metal layers of the N-type transistor component and P-type transistor component are produced and processed respectively. Such mode leads to complicated manufacturing process and high cost.

In the second mode, firstly a work function metal layer of the P-type transistor component, i.e., P-type work function metal layer 106, is grow, and then a work function metal layer of the N-type transistor component, i.e., N-type work function metal layer, is grown after. Such mode is more competitive and has a faster processing speed. In the implementation, the P-type work function metal layer is fully grown first, then the P-type work function metal layer formed at the position of the N-type transistor component is etched away, and then the N-type work function metal layer is grown. In this case, in the SRAM region, since the N-type transistor component and the P-type transistor component share the same metal gate and are very close to each other. The Al element in the N-type work function metal layer and the metal gate migrate laterally due to a temperature effect, which affects the P-type work function metal layer and causes a change to the electrical properties of the P-type transistor component, e.g., an increase in the absolute value of a threshold voltage of the P-type transistor component.

In an improved version of the existing method of the second mode, a TaN barrier layer is added to the side surface of the metal layer of the P-type work function metal layer, so as to reduce the diffusion of Al into the N-type work function metal layer or metal gate into the P-type work function metal layer, thereby reducing the impact on the threshold voltage of the PMOS. However, the added TaN barrier layer sacrifices the process window filled with a metal gate such as an Al gate, and increases the threshold voltage of the NMOS.

BRIEF SUMMARY

According to some embodiments in this application, the method for manufacturing a high dielectric constant metal gate of an NMOS and a PMOS is disclosed in the following steps:

step 1: providing a semiconductor substrate, and forming an interface layer on the surface of the semiconductor substrate in a region for forming a gate structure of the NMOS and in a region for forming a gate structure of the PMOS, the interface layer being composed of an oxide layer formed by oxidizing the semiconductor substrate; wherein a plurality of the NMOSs and a plurality of the PMOSs are simultaneously integrated on the semiconductor substrate; and the NMOSs include a first NMOS, the PMOSs include a first PMOS, the first NMOS and the first PMOS are adjacent to each other and share the metal gate, and a region for forming a gate structure of the first NMOS and a region for forming a gate structure of the first PMOS are in communication with each other and form a first gate formation region;

step 2, forming a high dielectric constant layer on the surface of the interface layer;

step 3, performing a decoupled plasma nitridation (DPN) process, the decoupled plasma nitridation process doping the high dielectric constant layer with nitrogen;

step 4, performing post nitridation anneal (PNA) on the high dielectric constant layer; wherein a temperature of the post nitridation anneal is set below a first temperature, so as to reduce the number of oxygen vacancies in the high dielectric constant layer; a lower temperature of the post nitridation anneal corresponds to a smaller number of oxygen vacancies in the high dielectric constant layer; and the first temperature is set according to a maximum offset value of a threshold voltage of the first PMOS, and a smaller maximum offset value of the threshold voltage of the first PMOS corresponds to a lower first temperature;

step 5, forming a P-type work function metal layer, the P-type work function metal layer being formed simultaneously in the region for forming the gate structure of the NMOS and in the region for forming the gate structure of the PMOS;

step 6, removing the P-type work function metal layer in the region for forming the gate structure of the NMOS, and retaining the P-type work function metal layer in the region for forming the gate structure of the PMOS;

step 7, forming an N-type work function metal layer, the N-type work function metal layer being formed simultaneously in the region for forming the gate structure of the NMOS and in the region for forming the gate structure of the PMOS; wherein in the region for forming the gate structure of the PMOS, the N-type work function metal layer is stacked on the surface of the P-type work function metal layer; and in the first gate formation region, a first side surface of the P-type work function metal layer is an interface, the N-type work function metal layer extends across the interface to the top surface of the P-type work function metal layer, lateral diffusion of metal from the N-type work function metal layer to the P-type work function metal layer occurs at the interface, the laterally diffused metal is fixed at the oxygen vacancy in the high dielectric constant layer by forming dipoles, the dipoles reduce a work function value of the P-type work function metal layer and increases the threshold voltage of the first PMOS, and the number of the dipoles is reduced by reducing the number of the oxygen vacancies in the high dielectric constant layer in step 4, so that an offset value of the threshold voltage of the first PMOS is determined by the number of the oxygen vacancies in the high dielectric constant layer; and step 8, forming the metal gate, the metal gate being formed simultaneously in the region for forming the gate structure of the NMOS and in the region for forming the gate structure of the PMOS, wherein in the first gate formation region, the metal gate extends from the region for forming the gate structure of the first NMOS to the region for forming the gate structure of the first PMOS.

In some cases, in step 1, the material of the semiconductor substrate includes silicon.

In some cases, the interface layer is formed by means of a thermal oxidation process.

In some cases, in step 2, the material of the high dielectric constant layer includes hafnium dioxide.

In some cases, in step 4, the maximum offset value of the threshold voltage of the first PMOS is less than 10 mV.

In some cases, in step 5, the material of the P-type work function metal layer includes TiN.

In some cases, in step 7, the material of the N-type work function metal layer includes TiAl, TiAlC, and TiAlN.

Al in the N-type work function metal layer diffuses to the surface of the high dielectric constant layer at the bottom of the P-type work function metal layer through the side surface of the P-type work function metal layer.

In some cases, in step 8, the material of the metal gate includes Al.

In some cases, after step 4 and before step 5, further including a step of forming a bottom barrier metal on the surface of the high dielectric constant layer.

In some cases, the bottom barrier metal is formed by stacking a TiN layer and a TaN layer.

In some cases, an integrated circuit formed by the NMOS and the PMOS on the semiconductor substrate includes an SRAM, a cell structure of the SRAM includes a first CMOS inverter, a second CMOS inverter, a first selection transistor, and a second selection transistor, an input end of the first CMOS inverter is connected to an output end of the second CMOS inverter, and an output end of the first CMOS inverter is connected to an input end of the second CMOS inverter.

In some cases, the first CMOS inverter is formed by connecting one of the first NMOSs and one of the first PMOSs, the first NMOS of the first CMOS inverter acts as a pull-down transistor of the first CMOS inverter, and the first PMOS of the first CMOS inverter acts as a pull-up transistor of the first CMOS inverter.

The second CMOS inverter is formed by connecting one of the first NMOSs and one of the first PMOSs, the first NMOS of the second CMOS inverter acts as a pull-down transistor of the second CMOS inverter, and the first PMOS of the second CMOS inverter acts as a pull-up transistor of the second CMOS inverter.

In some cases, the first selection transistor is composed of one of the NMOSs, and the second selection transistor is composed of one of the NMOSs.

In some cases, in step 1, a field oxide is formed in the semiconductor substrate, the field oxide defining an active region.

In the present application, the temperature of the post nitridation anneal of the high dielectric constant layer is set particularly, that is, the temperature of the post nitridation anneal is set below the first temperature corresponding to the maximum offset value of the threshold voltage of the first PMOS. In this way, the number of the oxygen vacancies in the high dielectric constant layer is kept small. Moreover, the present application adopts the following feature: after the metal of the N-type work function metal layer or the metal gate, such as Al, diffuses laterally to the P-type work function metal layer of the first PMOS, it is necessary to form a dipole at the oxygen vacancy, such as a dipole of Al and hafnium (Hf), to fix the metal at the bottom of the P-type work function metal layer of the first PMOS. The metal that actually affects the threshold voltage of the first PMOS is the metal that is fixed by means of the dipole. The number of metal atoms fixed by means of dipoles is less than the number of oxygen vacancies. By reducing the number of oxygen vacancies, the number of metal atoms fixed by means of dipoles can be reduced, and the impact of the laterally diffused metal on the threshold voltage of the first PMOS can be greatly reduced. Therefore, the present application reduces the adverse impact of the lateral metal diffusion on the threshold voltage of the first PMOS by reducing the number of the oxygen vacancies under the condition of a large metal diffusion amount. That is, an increase in the threshold voltage of the first PMOS is reduced, thereby improving the electrical performance of the first PMOS.

BRIEF DESCRIPTION OF THE DRAWINGS

The present application is described in detail below with reference to the drawings and specific implementations.

DETAILED DESCRIPTION OF THE DISCLOSURE

Figure 1:
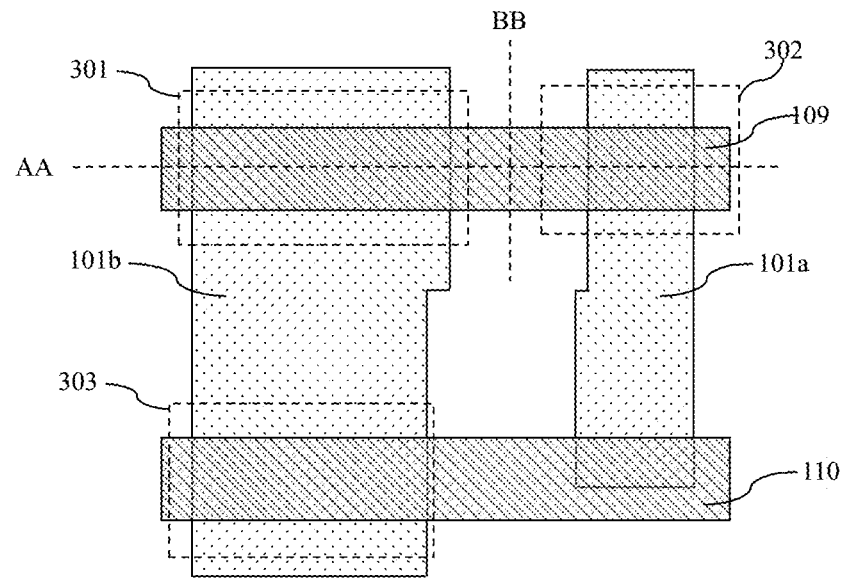
FIG. 1 is a layout of a half-bit cell structure of an SRAM with an existing HKMG.
Figure 2:
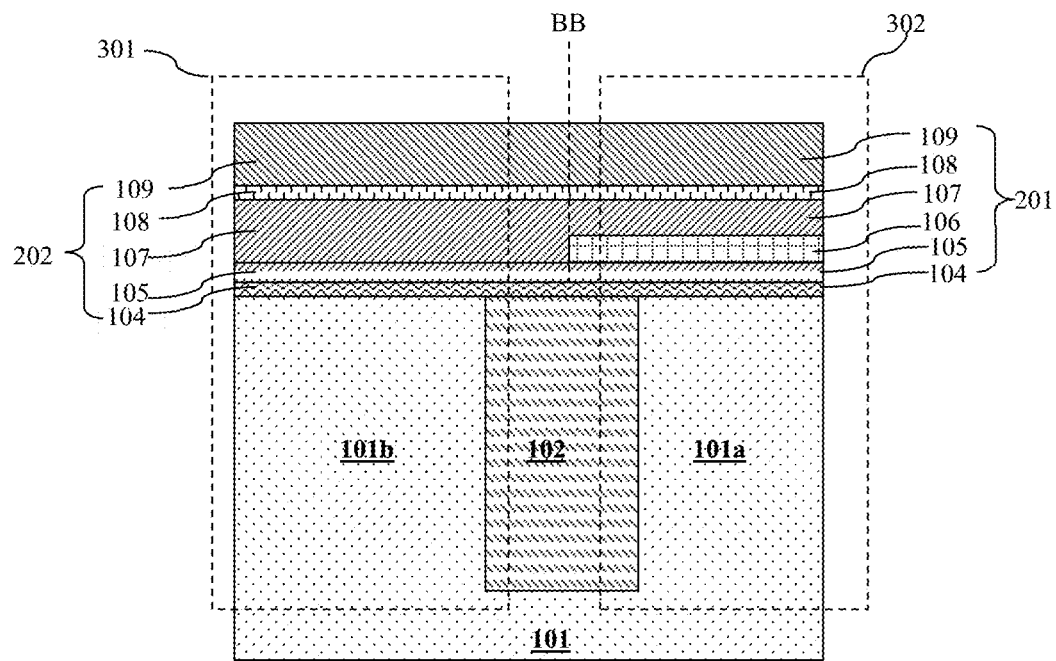
FIG. 2 is a cross-sectional view of a structure of two adjacent first PMOS and first NMOS as cut along line AA in FIG. 1.
Figure 3:
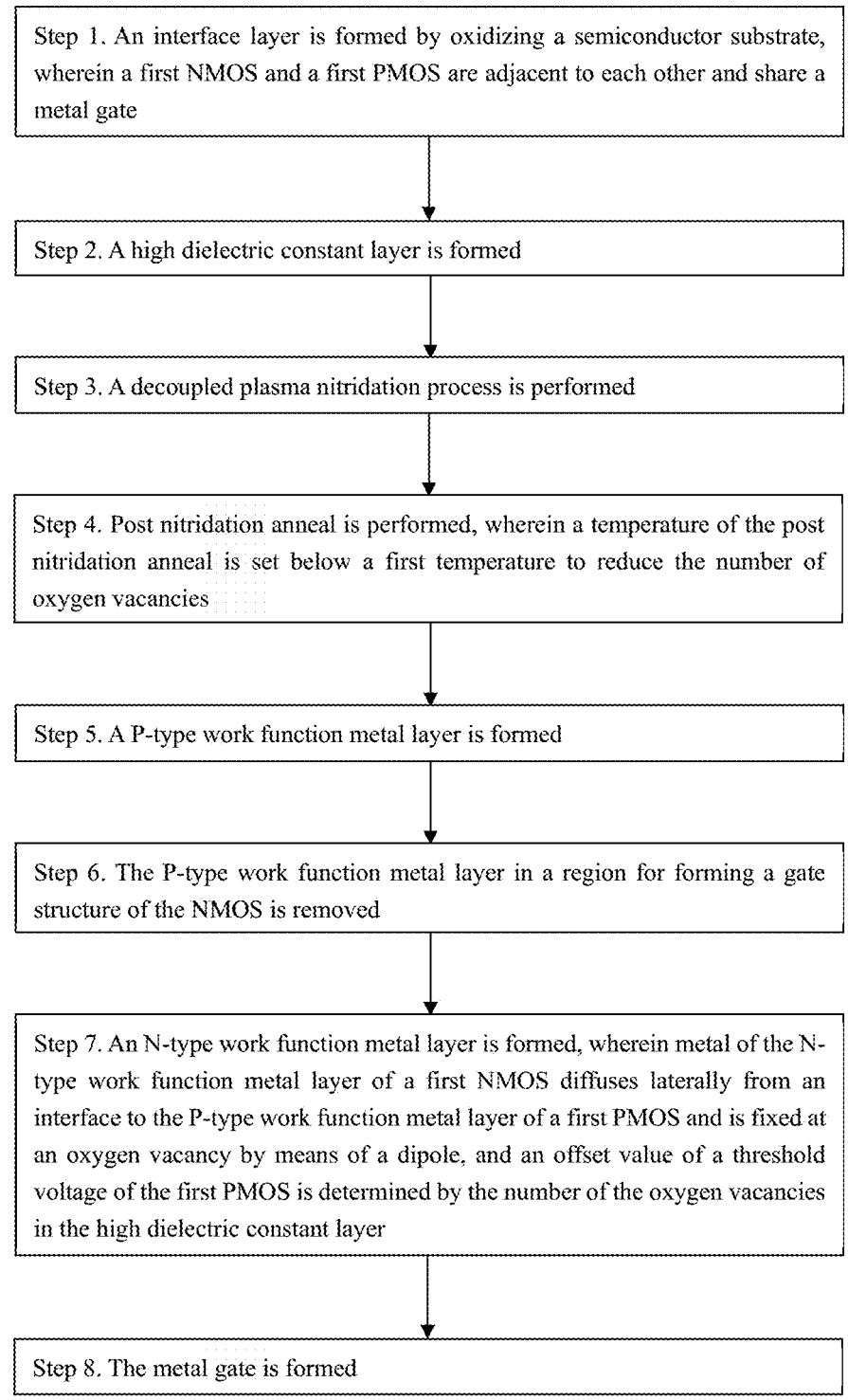
FIG. 3 is a flowchart of the method for manufacturing a high dielectric constant metal gate of an NMOS and a PMOS according to an embodiment of the present application.
Figure 4:
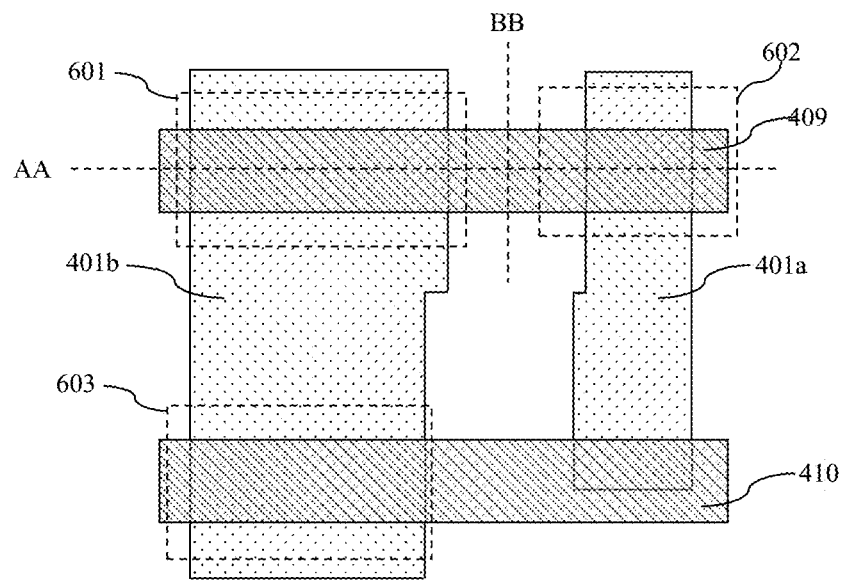
FIG. 4 is a layout of a half-bit cell structure of an SRAM with an HKMG formed by the method for manufacturing a high dielectric constant metal gate of an NMOS and a PMOS according to an embodiment of the present application.
Figure 5:
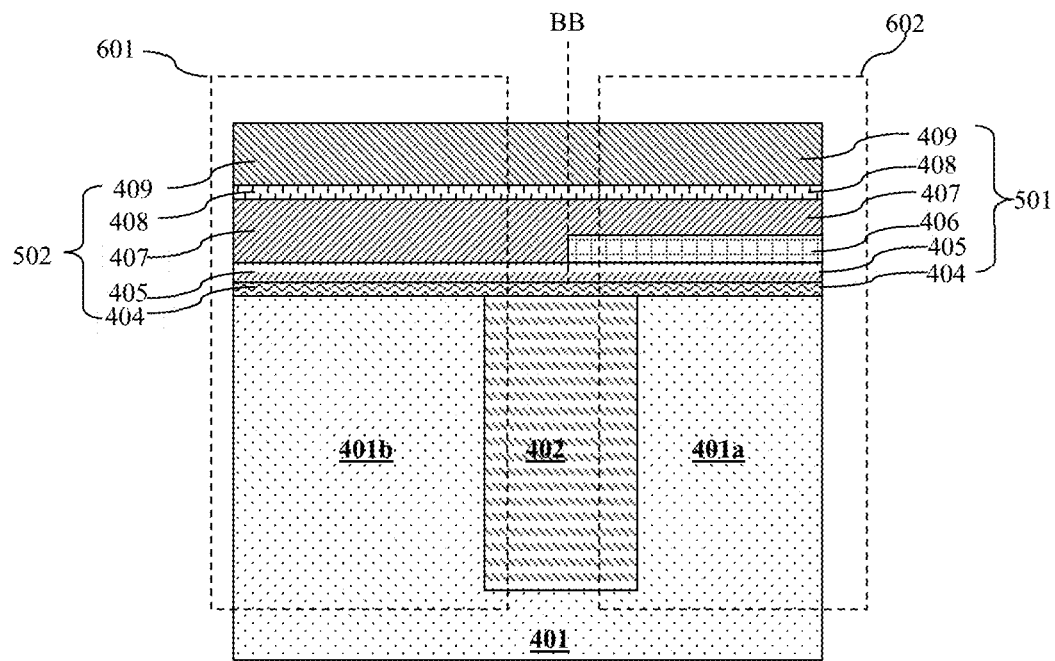
FIG. 5 is a cross-sectional view of a structure of two adjacent first PMOS and first NMOS as cut along line AA in FIG. 4.

FIG. 3 is a flowchart of a method for manufacturing a high dielectric constant metal gate 409 of an NMOS and a PMOS according to an embodiment of the present application. FIG. 4 is a layout of a half-bit cell structure of an SRAM with an HKMG formed by the method for manufacturing a high dielectric constant metal gate 409 of an NMOS and a PMOS according to an embodiment of the present application. FIG. 5 is a cross-sectional view of a structure of adjacent first PMOS and first NMOS cut along line AA in FIG. 4. The method for manufacturing the high dielectric constant metal gate 409 of an NMOS and a PMOS according to this embodiment of the present application includes the following steps.

Sep 1. Referring to FIG. 5, a semiconductor substrate 401 is provided, and an interface layer (not shown) is formed on the surface of the semiconductor substrate 401 in a region for forming a gate structure of the NMOS and in a region for forming a gate structure of the PMOS, the interface layer being composed of an oxide layer formed by oxidizing the semiconductor substrate 401.

A plurality of the NMOSs and a plurality of the PMOSs are simultaneously integrated on the semiconductor substrate 401.

The NMOSs comprise a first NMOS 601, and the PMOSs comprise a first PMOS 602. The first NMOS 601 and the first PMOS 602 are adjacent to each other and share the metal gate 409. A region for forming a gate structure of the first NMOS 601 and a region for forming a gate structure of the first PMOS 602 are in communication with each other and form a first gate formation region.

In this embodiment of the present invention, the material of the semiconductor substrate 401 includes silicon.

The interface layer is formed by means of a thermal oxidation process.

A field oxide 402 is formed in the semiconductor substrate 401, and the field oxygen 402 defines an active region. In some embodiments, the field oxide 402 is isolated by a shallow trench. FIG. 5 shows that a first active region 401a corresponding to the first PMOS 602 is adjacent to a second active region 401b corresponding to the first NMOS 601.

A step of forming a well region in the active region is included. A P-well is formed in the active region corresponding to the NMOS 601, and an N-well is formed in the active region corresponding to the PMOS 602. In FIG. 5, the N-well is formed in the first active region 401a and the P-well is formed in the second active region 401b.

Step 2. Referring to FIG. 5, a high dielectric constant layer 404 is formed on the surface of the interface layer.

In this embodiment of the present application, the material of the high dielectric constant layer 404 includes hafnium dioxide.

Step 3. A decoupled plasma nitridation process is performed, the decoupled plasma nitridation process doping the high dielectric constant layer 404 with nitrogen.

Step 4. Post nitridation anneal is performed on the high dielectric constant layer 404. The post nitridation anneal temperature is set below the first temperature, so as to reduce the number of oxygen vacancies in the high dielectric constant layer 404. A lower temperature of the post nitridation anneal corresponds to a smaller number of oxygen vacancies in the high dielectric constant layer 404.

The first temperature is set according to the maximum offset value of the threshold voltage of the first PMOS 602, and a smaller maximum offset value of the threshold voltage of the first PMOS 602 corresponds to a lower first temperature.

In this embodiment of the present application, the maximum offset value of the threshold voltage of the first PMOS 602 is less than 10 mV. In other embodiments, the maximum offset value of the threshold voltage of the first PMOS 602 can also be set according to actual needs. Upon setting of the maximum offset value of the threshold voltage of the first PMOS 602, the first temperature can be determined by experiments.

In some embodiments, a step of forming a bottom barrier metal 405 on the surface of the high dielectric constant layer 404 is also included.

The bottom barrier metal 405 is formed by stacking a TiN layer and a TaN layer together.

In an HK first MG last process, after formation of the TiN layer of the bottom barrier metal 405, a polysilicon dummy gate is formed subsequently, and the polysilicon dummy gate is formed by means of polysilicon deposition and etching to get patterned polysilicon gates. The polysilicon dummy gate is formed in the region for forming the gate structure of the NMOS and the region for forming the gate structure of the PMOS. In step 1, the interface layer is also formed on the surface of the semiconductor substrate outside the region for forming the gate structure of the NMOS and the region for forming the gate structure of the PMOS. After the patterned etching of the polysilicon of the polysilicon dummy gate, the high dielectric constant layer 404 and the interface layer are also etched so that the high dielectric constant layer 404 and the interface layer are located at the bottom of the polysilicon dummy gate.

Then, a spacer is formed on a side surface of the polysilicon dummy gate in a self-aligned manner, and a corresponding source and drain regions are formed in the active region on two sides of the polysilicon dummy gate. The source and drain regions of the NMOS are formed by means of N+ source and drain implantation, and the source and drain regions of the PMOS are formed by means of P+ source and drain implantation.

Next, a contact etch stop layer (CESL) is formed to form a zero interlayer film. The zero interlayer film layer is planarized to make the top surface of the zero interlayer film layer level with the top surface of the polysilicon dummy gate.

After that, the polysilicon dummy gate is removed, and a gate trench is formed in a region where the polysilicon dummy gate is removed. The gate trench is formed in both the region for forming the gate structure of the NMOS and the region for forming the gate structure of the PMOS.

Subsequently, the TaN layer of the bottom barrier metal 405 is formed.

Step 5. Referring to FIG. 5, a P-type work function metal layer 406 is formed, the P-type work function metal layer being formed simultaneously in the region for forming the gate structure of the NMOS and in the region for forming the gate structure of the PMOS.

In this embodiment of the present application, the material of the P-type work function metal layer 406 includes TiN.

Step 6. Referring to FIG. 5, the P-type work function metal layer 406 in the region for forming the gate structure of the NMOS is removed, and the P-type work function metal layer 406 in the region for forming the gate structure of the PMOS is retained.

Step 7. Referring to FIG. 5, an N-type work function metal layer 407 is formed, the N-type work function metal layer 407 being formed simultaneously in the region for forming the gate structure of the NMOS and in the region for forming the gate structure of the PMOS.

In the region for forming the gate structure of the PMOS, the N-type work function metal layer 407 is stacked on the surface of the P-type work function metal layer 406.

In the first gate formation region, a first side surface of the P-type work function metal layer 406 is an interface. In FIGS. 4 and 5, the side surface corresponding to dashed line BB is the interface. The N-type work function metal layer 407 extends across the interface to the top surface of the P-type work function metal layer 406. Lateral diffusion of metal from the N-type work function metal layer 407 to the P-type work function metal layer 406 occurs at the interface. The laterally diffused metal is fixed at the oxygen vacancy in the high dielectric constant layer 404 by forming a dipole. The dipole reduces a work function value of the P-type work function metal layer 406 and increases the threshold voltage of the first PMOS 602. The number of the dipoles is reduced by reducing the number of the oxygen vacancies in the high dielectric constant layer 404 in step 4, so that an offset value of the threshold voltage of the first PMOS 602 is determined by the number of the oxygen vacancies in the high dielectric constant layer 404.

In this embodiment of the present application, the material of the N-type work function metal layer 407 includes TiAl, TiAlC, and TiAlN.

Al in the N-type work function metal layer 407 diffuses to the surface of the high dielectric constant layer 404 at the bottom of the P-type work function metal layer 406 through the side surface of the P-type work function metal layer 406.

Step 8. Referring to FIG. 5, the metal gate 409 is formed, the metal gate 409 being formed simultaneously in the region for forming the gate structure of the NMOS and in the region for forming the gate structure of the PMOS. In the first gate formation region, the metal gate 409 extends from the region for forming the gate structure of the first NMOS 601 to the region for forming the gate structure of the first PMOS 602.

In this embodiment of the present application, the material of the metal gate 409 includes Al.

Then a metal interconnection process is performed.

In this embodiment of the present application, an integrated circuit formed by the NMOS and the PMOS on the semiconductor substrate 401 includes an SRAM. A cell structure of the SRAM includes a first CMOS inverter, a second CMOS inverter, a first selection transistor, and a second selection transistor. An input end of the first CMOS inverter is connected to an output end of the second CMOS inverter, and an output end of the first CMOS inverter is connected to an input end of the second CMOS inverter.

The layout in FIG. 4 shows a half circuit diagram of a bit cell structure of the SRAM, which is referred to as the layout of a half-bit cell structure for short. An NMOS 603 is also shown in FIG. 4.

The first CMOS inverter and the second CMOS inverter are fully symmetrical and both can adopt the layout structure in FIG. 4.

When the first CMOS inverter adopts the layout structure in FIG. 4, the first CMOS inverter is formed by connecting one of the first NMOSs 601 and one of the first PMOSs 602. The first NMOS 601 of the first CMOS inverter acts as a pull-down transistor of the first CMOS inverter, and the first PMOS 602 of the first CMOS inverter acts as a pull-up transistor of the first CMOS inverter. The NMOS 603 acts as the first selection transistor.

When the second CMOS inverter adopts the layout structure in FIG. 4, the second CMOS inverter is formed by connecting one of the first NMOSs 601 and one of the first PMOSs 602 of the second CMOS inverter. The first NMOS 601 of the second CMOS inverter acts as a pull-down transistor of the second CMOS inverter, and the first PMOS 602 of the second CMOS inverter acts as a pull-up transistor of the second CMOS inverter. The NMOS 603 acts as the second selection transistor.

Two of the symmetrical half-bit cell structures as shown in FIG. 4 form a full-bit cell structure.

In this embodiment of the present application, the post nitridation anneal temperature of the high dielectric constant layer 404 is set specifically, for instance, the post nitridation anneal temperature can be set below the first temperature which corresponds to the maximum offset value of a threshold voltage of the first PMOS 602. In this way, the number of the oxygen vacancies in the high dielectric constant layer 404 is kept small. Moreover, this embodiment of the present application adopts the following feature: after the metal of the N-type work function metal layer 409 or the metal gate 409, such as Al, diffuses laterally to the P-type work function metal layer 406 of the first PMOS 602, it is necessary to form dipoles at the oxygen vacancy spots, such as dipoles composing an Al ion and a hafnium (Hf) ion, to fix the metal (Al, Hf) at the bottom of the P-type work function metal layer 406 of the first PMOS 602. The metal that actually affects the threshold voltage of the first PMOS 602 is the metal that is fixed by means of the dipoles. The number of metal atoms fixed by means of the dipoles is less than the number of oxygen vacancies in the region. By reducing the number of oxygen vacancies, the number of metal atoms fixed by means of dipoles can be reduced, and the impact of the laterally diffused metal affecting the threshold voltage of the first PMOS 602 can be greatly reduced. Therefore, this embodiment of the present application reduces the adverse impact of the lateral metal diffusion on the threshold voltage of the first PMOS 602 by reducing the number of the oxygen vacancies under the condition if a large amount of metal diffuses. That is, the possibility of threshold voltage of the first PMOS 602 increase is reduced, thereby improving the electrical performance of the first PMOS 602.

Figure 6A:
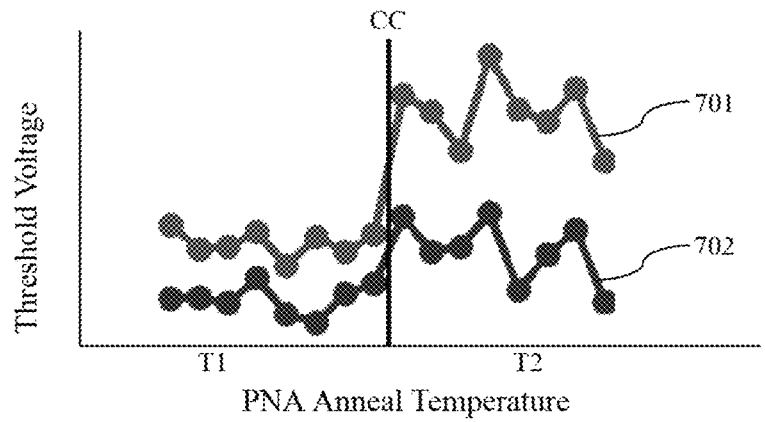
FIG. 6A illustrate a data chart for the threshold voltage of the first PMOS as a function of the post nitridation anneal temperature when an interface is located above a field oxide of the first NMOS and the first PMOS, comparing to the threshold voltage of the first PMOS as a function of the post nitridation anneal temperature when the interface is located above an active region of the first NMOS, using the method for manufacturing a high dielectric constant metal gate of an NMOS and a PMOS according to an embodiment of the present application.

FIG. 6A illustrate a data chart for the threshold voltage 701 of the first PMOS 602 as a function of the post nitridation anneal temperature when an interface BB is located above a field oxide 402 of the first NMOS 601 and the first PMOS 602, compared to the threshold voltage 702 of the first PMOS 602 as a function of the post nitridation anneal temperature when the interface is located above the active region, i.e., the second active region 401b, of the first NMOS 601, in the method for manufacturing a high dielectric constant metal gate of an NMOS and a PMOS according to this embodiment of the present application. In FIG. 6A, the post nitridation anneal temperature on the right side of line CC is T2, and the post nitridation anneal temperature on the left side of line CC is T1. T2 is greater than T1. It can be seen from the data points 701 that, during anneal performed at temperatures T2 and T1, the threshold voltage of the first PMOS 602 corresponding to temperature T1 is reduced. This is because when T1 is relatively low, the number of the oxygen vacancies formed in the high dielectric constant layer 404 at T1 is relatively small, thus reducing the threshold voltage of the first PMOS 602.

In the data points 702, the threshold voltage of the first PMOS 602 changes little during anneal performed at temperatures T2 and T1. This is because the interface BB is located above the second active region 401b and is far away from the top of the first active region 401*a* of the first PMOS 602. Therefore, even if lateral metal diffusion occurs, it is not easy to reach the top region of the first active region 401*a*, thus causing no significant impact on the threshold voltage of the first PMOS 602. The threshold voltage of the first PMOS 602 corresponding to the temperature T1 in the data points 701 shows a little difference from the threshold voltage of the first PMOS 602 corresponding to the temperatures T1 and T2 in the data points 702. Therefore, for data points 702, the effect of the post nitridation anneal temperature on the threshold voltage of the first PMOS 602 can be the same if the interface BB is set away from the first active region 401*a* of the first PMOS 602.

Figure 6B:
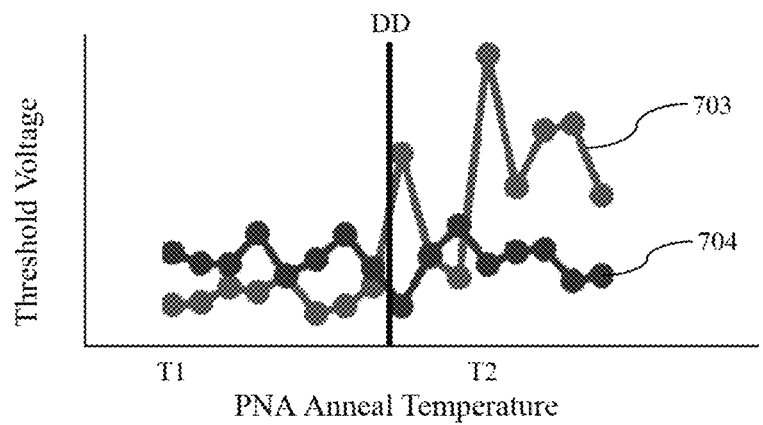
FIG. 6B illustrate a data chart for the threshold voltage of the first PMOS as a function of the post nitridation anneal temperature when the interface is located above the field oxide of the first NMOS and the first PMOS, compared to the threshold voltage of a PMOS that does not share the metal gate with the NMOS as a function of the post nitridation anneal temperature, in the method for manufacturing a high dielectric constant metal gate of an NMOS and a PMOS according to an embodiment of the present application.

FIG. 6B illustrate a data chart 703 of the threshold voltage of the first PMOS 602 as a function of the post nitridation anneal temperature when the interface BB is located above the field oxide 402 of the first NMOS 601 and the first PMOS 602 and data points 704 of a threshold voltage of a PMOS that does not share the metal gate with the NMOS as a function of the post nitridation anneal temperature, in the method for manufacturing a high dielectric constant metal gate of an NMOS and a PMOS according to this embodiment of the present application.

The data points 703 are similar to the data points 701, but includes different specific experimental data.

In the data points 704, the threshold voltage of the PMOS changes little for anneal temperatures T2 or T1. This is because the metal gate of the PMOS is not adjacent to and in contact with the metal gate of the NMOS, and the lateral diffusion of the metal from the metal gate or the N-type work function metal layer of the NMOS to the P-type work function metal layer of the PMOS does not occur. In this case, the threshold voltages of the PMOS at T1 and T2 change little. Comparing the data points 703 and the data points 704, it can be seen that the threshold voltage of the first PMOS 602 corresponding to temperature T1 in the data points 703 has a little difference from the threshold voltage of the PMOS 602 corresponding to the anneal temperatures T1 and T2 in the data points 704. Therefore, by reducing the post nitridation anneal temperature, the anneal temperatures effect on the threshold voltage of the first PMOS 602 can be the same for all data points 704.

Figure 7A:
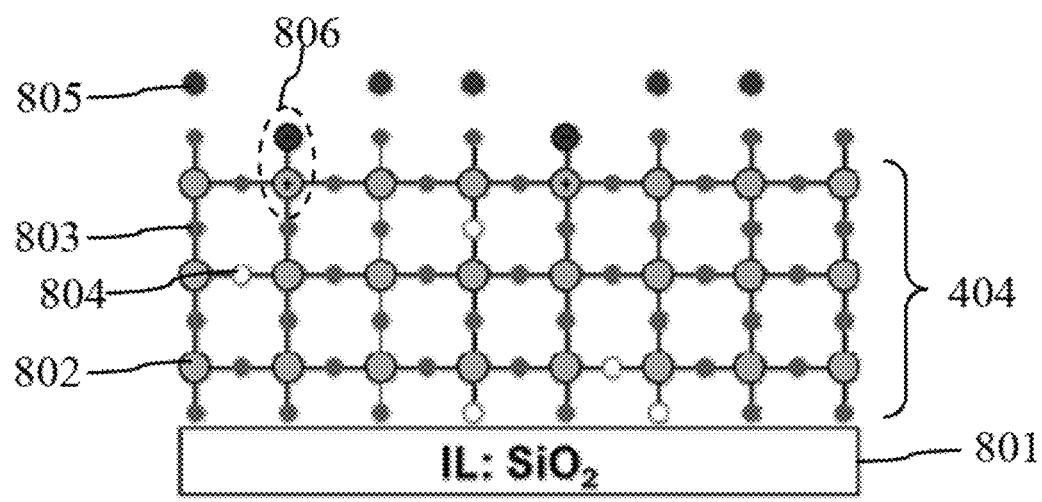
FIG. 7A is a diagram of a lattice of a high dielectric constant layer in a case where the interface is located above the field oxide of the first NMOS and the first PMOS and the post nitridation anneal temperature is lower than a preset first temperature corresponding to the maximum offset value of the threshold voltage of the first PMOS, in the method for manufacturing a high dielectric constant metal gate of an NMOS and a PMOS according to an embodiment of the present application.

FIG. 7A is a diagram of the lattice of the high dielectric constant layer in a case where the interface is located above the field oxide 402 of the first NMOS 601 and the first PMOS 602, and the post nitridation anneal temperature is lower than the preset first temperature, in the method for manufacturing a high dielectric constant metal gate of an NMOS and a PMOS according to this embodiment of the present application. The anneal temperature T1 is lower than the first temperature, and the post nitridation anneal temperature corresponding to FIG. 7A is T1. FIG. 7A shows the interface layer 801. The high dielectric constant layer 404 formed on the interface layer 801 is represented by a lattice structure. In FIG. 7A, a circle 802 represents an Hf atom, a circle 803 represents an oxygen atom, a circle 804 represents an oxygen vacancy, a circle 805 represents an Al atom, and a dashed-lined oval 806 represents a dipole composing a positive ion of Hf and a negative ion of Al. Hf (atomic number=72, atomic weight=178.49) is a much heavier atom than Al (atomic number=13, atomic weight=26.98). Hf has complete ground state electronic configuration represented as: 1s2 2s2 2p6 3s2 3p6 3d10 4s2 4p6 4d10 5s2 5p6 4f14 5d2 6s2. A Hf-Al dipole has 3 co-valence electrons in the outer orbit, thus the Hf which has to share part of one of two electrons shows as a positive ion and Al which gains part of one electron shows as a negative ion in the dipole.

Figure 7B:
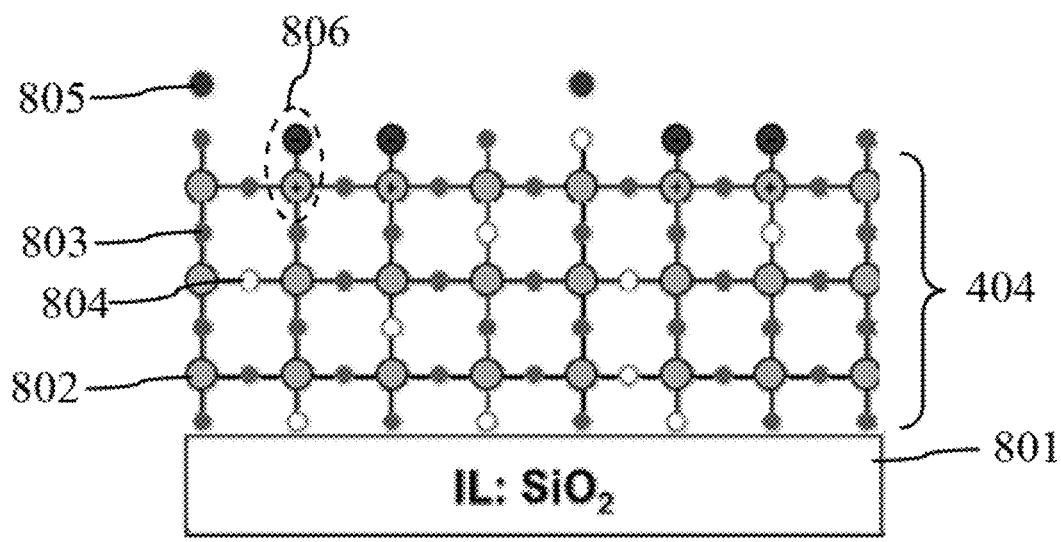
FIG. 7B is a diagram of a lattice of the high dielectric constant layer in a case where the interface is located above the field oxide of the first NMOS and the first PMOS and the post nitridation anneal temperature is higher than the first temperature, in the method for manufacturing a high dielectric constant metal gate of an NMOS and a PMOS according to an embodiment of the present application.

FIG. 7B is a diagram of a lattice of the high dielectric constant layer in a case where the interface is located above the field oxide 402 of the first NMOS 601 and the first PMOS 602 and the post nitridation anneal temperature is higher than the first temperature, in the method for manufacturing a high dielectric constant metal gate of an NMOS and a PMOS according to this embodiment of the present application. The anneal temperature T2 is higher than the first temperature, and the post nitridation anneal temperature corresponding to FIG. 7B is T2. Comparing FIG. 7A and FIG. 7B, it can be seen that the number of the oxygen vacancies 804 in FIG. 7A is reduced, and the number of the dipoles 806 is also reduced. Therefore, generation of the dipoles can be suppressed by reducing the post nitridation anneal temperature. That is, even if the lateral diffusion of Al is severe, less dipoles 806 are formed finally due to less available oxygen vacancies 804.

Figure 7C:
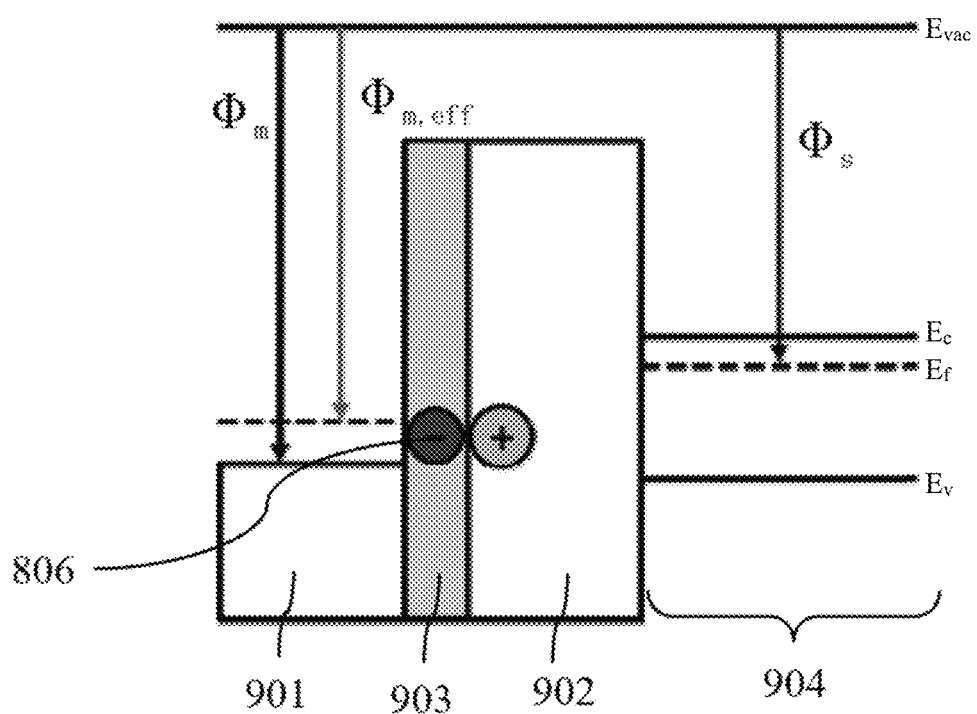
FIG. 7C is a diagram of an energy band of the first PMOS in the method for manufacturing a high dielectric constant metal gate of an NMOS and a PMOS according to an embodiment of the present application.

FIG. 7C is a diagram of an energy band of the first PMOS 602 in the method for manufacturing a high dielectric constant metal gate of an NMOS and a PMOS according to this embodiment of the present application. In FIG. 7C, a region 901 represents an energy band of the P-type work function metal layer 406, a region 902 represents an energy band of the high dielectric constant layer 404, a region 903 represents an energy band of a region for forming the dipoles 806, and a region 904 corresponds to an energy band of the N-well in the first active region 401*a*. $\Phi_m$ represents a work function of the P-type work function metal layer 406, and $\Phi_{m,eff}$ represents an effective work function of the P-type work function metal layer 406 affected by the dipoles 806. It can be seen that $\Phi_{m,eff}$ is reduced, so the absolute value of the threshold voltage of the first PMOS 602 is increased. In FIG. 7C, $E_f$ represents Fermi energy level, $E_{vac}$ represents the vacuum energy level, $E_c$ represents the bottom of the conduction band, and $E_v$ represents the top of the valence band. $\Phi_s$ represents the work function of the semiconductor material in the N-well of the first active region 401*a*.

Figure 8A:
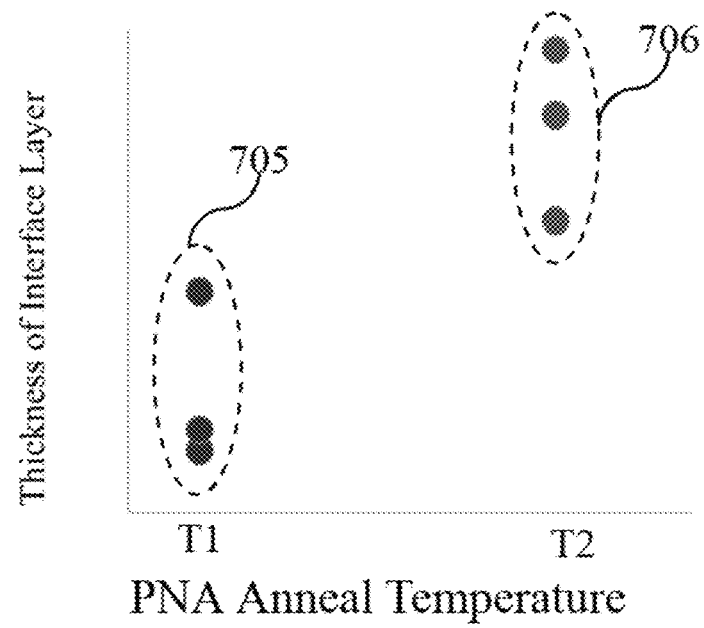
FIG. 8A is a diagram of the thickness of an interface layer as a function of the post nitridation anneal temperature in the method for manufacturing a high dielectric constant metal gate of an NMOS and a PMOS according to an embodiment of the present application.

FIG. 8A is a diagram of the thickness of an interface layer versus the post nitridation anneal temperature in the method for manufacturing a high dielectric constant metal gate of an NMOS and a PMOS according to an embodiment of the present application. The thickness of the interface layer is measured by means of X-ray photoelectron spectroscopy (XPS). A thickness value at temperature T1 is as shown in a dashed-line oval circle 705, and a thickness value at temperature T2 is as shown in a dashed-line oval circle 706. It can be seen that the thickness of the interface layer is increased with the higher post nitridation anneal temperatures, it is because the interface layer captures oxygen atoms in the high dielectric constant layer and oxidizes the semiconductor substrate after the increase of the post nitridation anneal temperature, thus increasing the thickness of the interface layer.

Figure 8B:
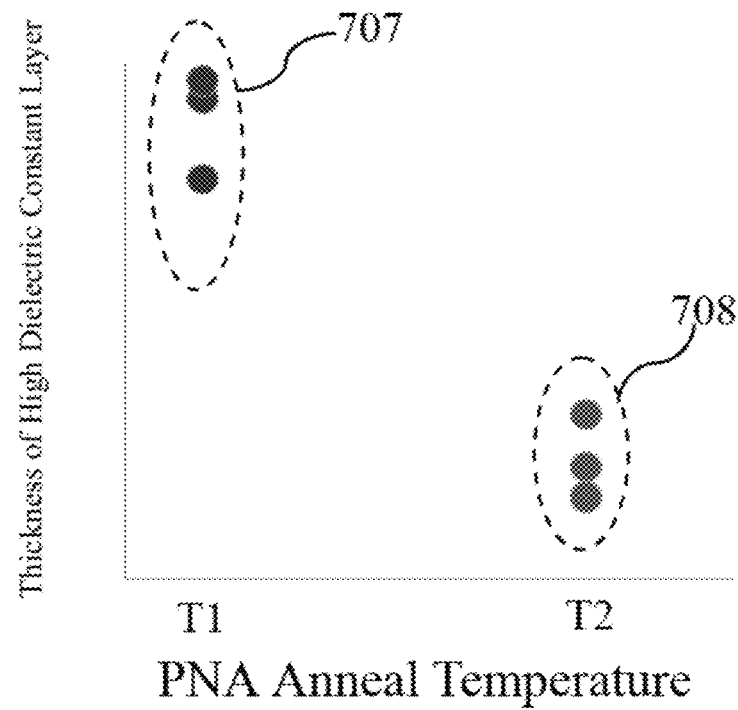
FIG. 8B is a diagram of the thickness of the high dielectric constant layer as a function of the post nitridation anneal temperature in the method for manufacturing a high dielectric constant metal gate of an NMOS and a PMOS according to an embodiment of the present application.

FIG. 8B is a diagram showing the thickness of the high dielectric constant layer versus the post nitridation anneal temperature in the method for manufacturing a high dielectric constant metal gate of an NMOS and a PMOS according to an embodiment of the present application. The high dielectric constant layer thickness value at anneal temperature T1 is as shown in a dashed-line oval circle 707, and a thickness value at anneal temperature T2 is as shown in a dashed-line oval circle 708. It can be seen that the thickness of the high dielectric constant layer is reduced with the increase of the post nitridation anneal temperature, because the oxygen in the high dielectric constant layer is captured by the interface layer after the increase of the post nitridation anneal temperature. Therefore, in this embodiment of the present application, by setting the post nitridation anneal temperature, the interface layer is prevented from capturing the oxygen atoms in the high dielectric constant layer, thereby reducing the oxygen vacancies in the high dielectric constant layer.

The present application is described in detail above via specific embodiments, which, however, do not intended to limit the present application. Without departing from the principle of the present application, those skilled in the art can also make many other changes and improvements, which shall also be considered as the scope of protection the present application.

What is claimed is:

1. A method for manufacturing a metal gate having a high dielectric constant for NMOS and PMOS, wherein the method comprises following steps:
   step 1: providing a semiconductor substrate, and forming an interface layer on a surface of the semiconductor substrate, wherein the interface layer is disposed in a region for forming a gate structure of the NMOS and a gate structure of the PMOS, wherein the interface layer comprises an oxide layer, wherein the oxide layer is formed by oxidizing the surface of the semiconductor substrate;
   wherein the NMOS and the PMOS are integrated on the semiconductor substrate; and
   wherein the NMOS comprises a first NMOS device, wherein the PMOS comprise a first PMOS device, wherein the first NMOS device and the first PMOS device are configured to be adjacent to each other and to share the metal gate, and wherein a gate structure of the first NMOS device and a gate structure of the first PMOS device share a first gate formation region;
   step 2, forming a high dielectric constant layer on a surface of the interface layer;
   step 3, performing a decoupled plasma nitridation process to dope the high dielectric constant layer with nitrogen;
   step 4, performing post nitridation annealing on the high dielectric constant layer, wherein a post nitridation anneal temperature is configured to set below a preset first temperature, so as to reduce the number of oxygen vacancies in the high dielectric constant layer; a lower temperature of the post nitridation anneal corresponds to a smaller number of oxygen vacancies in the high dielectric constant layer;
   wherein the preset first temperature is set according to a maximum offset value of a threshold voltage of the first PMOS device, wherein if the maximum offset value of the threshold voltage of the first PMOS device is smaller, the preset first temperature becomes lower;
   step 5, forming a P-type work function metal layer, wherein the P-type work function metal layer is formed in the region for both of the gate structures of the NMOS and the PMOS;
   step 6, removing the P-type work function metal layer from the gate structure of the NMOS, and retaining the P-type work function metal layer in the gate structure of the PMOS;
   step 7, forming an N-type work function metal layer, wherein the N-type work function metal layer is formed in the gate structures of the NMOS and the PMOS;
   wherein the N-type work function metal layer is stacked on a top surface of the P-type work function metal layer in the gate structure of the PMOS;
   wherein in the first gate formation region, a first side surface of the P-type work function metal layer forms an interface between the P-type and N-type work function metal layers over the PMOS, wherein as the N-type work function metal layer over the NMOS extends across the interface to the top surface of the P-type work function metal layer over the PMOS, lateral diffusion of metal atoms occurs at the interface from the N-type work function metal layer to the P-type work function metal layer, wherein the laterally diffused metal atoms replace spots of oxygen vacancies the in the high dielectric constant layer,
   wherein one of the metal atoms forms a dipole with a metal atom in the P-type work function metal layer, thus reducing a work function value of the P-type work function metal layer and increasing the threshold voltage of the first PMOS device; and
   wherein a number of the dipoles is reduced by reducing the number of the oxygen vacancies in the high dielectric constant layer in step 4, so that an offset value of the threshold voltage of the first PMOS device is determined by the number of the oxygen vacancies in the high dielectric constant layer; and
   step 8, forming the metal gate in the same region of the gate structure of the NMOS and the gate structure of the PMOS, wherein in the first gate formation region, the metal gate extends from the gate structure of the first NMOS device to the gate structure of the first PMOS device.

2. The method for manufacturing the metal gate having the high dielectric constant for NMOS and PMOS according to claim 1, wherein in step 1, a material of the semiconductor substrate comprises silicon.

3. The method for manufacturing the metal gate having the high dielectric constant for NMOS and PMOS according to claim 2, wherein the interface layer is formed by means of a thermal oxidation process.

4. The method for manufacturing the metal gate having the high dielectric constant for NMOS and PMOS according to claim 1, wherein in step 2, a material of the high dielectric constant layer comprises hafnium dioxide.

5. The method for manufacturing the metal gate having the high dielectric constant for NMOS and PMOS according to claim 4, wherein in step 4, the maximum offset value of the threshold voltage of the first PMOS is less than 10 mV.

6. The method for manufacturing the metal gate having the high dielectric constant for NMOS and PMOS according to claim 4, wherein in step 5, a material of the P-type work function metal layer comprises TiN.

7. The method for manufacturing the metal gate having the high dielectric constant for NMOS and PMOS according to claim 6, wherein in step 7, a material of the N-type work function metal layer comprises TiAl, TiAlC, and TiAlN; and
   wherein Al in the N-type work function metal layer diffuses to a surface of the high dielectric constant layer at a bottom of the P-type work function metal layer through the first side surface of the P-type work function metal layer.

8. The method for manufacturing the metal gate having the high dielectric constant for NMOS and PMOS according to claim 7, wherein in step 8, a material of the metal gate comprises Al.

9. The method for manufacturing the metal gate having the high dielectric constant for NMOS and PMOS according to claim 1, after step 4 and before step 5, further comprising a step of forming a bottom barrier metal on the surface of the high dielectric constant layer.

10. The method for manufacturing the metal gate having the high dielectric constant for NMOS and PMOS according to claim 9, wherein the bottom barrier metal is formed by stacking a TiN layer and a TaN layer.

11. The method for manufacturing the metal gate having the high dielectric constant for NMOS and PMOS according to claim 1, wherein an integrated circuit having the NMOS and the PMOS on the semiconductor substrate comprises an SRAM, a cell structure of the SRAM comprises a first CMOS inverter, a second CMOS inverter, a first selection transistor, and a second selection transistor, wherein an input end of the first CMOS inverter is connected to an output end of the second CMOS inverter, and wherein an output end of the first CMOS inverter is connected to an input end of the second CMOS inverter.

12. The method for manufacturing the metal gate having the high dielectric constant for NMOS and PMOS according to claim 11, wherein the first CMOS inverter is formed by connecting the first NMOS device and the first PMOS, the first NMOS device of the first CMOS inverter acts as a pull-down transistor of the first CMOS inverter, and the first PMOS device of the first CMOS inverter acts as a pull-up transistor of the first CMOS inverter; and wherein the second CMOS inverter is formed by connecting the first NMOS device and the first PMOS device, wherein the first NMOS device of the second CMOS inverter acts as a pull-down transistor of the second CMOS inverter, and the first PMOS device of the second CMOS inverter acts as a pull-up transistor of the second CMOS inverter.

13. The method for manufacturing the metal gate having the high dielectric constant for NMOS and PMOS according to claim 12, wherein the first selection transistor comprises the NMOS, and the second selection transistor comprises the NMOS.

14. The method for manufacturing the metal gate having the high dielectric constant for NMOS and PMOS according to claim 1, wherein in step 1, a field oxide is formed in the semiconductor substrate, wherein the field oxide forms an active region.

* * * * *